(12) United States Patent
Koo et al.

(10) Patent No.: US 12,310,039 B2
(45) Date of Patent: May 20, 2025

(54) SEMICONDUCTOR DEVICE INCLUDING EPITAXIAL ELECTRODE LAYER AND DIELECTRIC EPITAXIAL STRUCTURE AND METHOD OF MANUFACTURING THE SAME

(71) Applicant: SK hynix Inc., Icheon-si (KR)

(72) Inventors: Won Tae Koo, Icheon-si (KR); Dong Ik Suh, Icheon-si (KR)

(73) Assignee: SK hynix Inc., Icheon-si (JP)

( * ) Notice: Subject to any disclaimer, the term of this patent is extended or adjusted under 35 U.S.C. 154(b) by 613 days.

(21) Appl. No.: 17/692,750

(22) Filed: Mar. 11, 2022

(65) Prior Publication Data

US 2023/0103835 A1    Apr. 6, 2023

(30) Foreign Application Priority Data

Oct. 5, 2021 (KR) .......................... 10-2021-0132006

(51) Int. Cl.
*H10D 1/68* (2025.01)
*H01L 21/02* (2006.01)

(52) U.S. Cl.
CPC ....... *H10D 1/684* (2025.01); *H01L 21/02293* (2013.01)

(58) Field of Classification Search
CPC ............ H01L 28/40; H01L 28/56; H01G 4/10
See application file for complete search history.

(56) References Cited

U.S. PATENT DOCUMENTS

| | | | | |
|---|---|---|---|---|
| 6,151,240 | A | * | 11/2000 | Suzuki .................... H01L 28/75 257/295 |
| 2017/0365719 | A1 | * | 12/2017 | Chen ................. H01L 29/40111 |
| 2019/0318774 | A1 | * | 10/2019 | Kittl .................... G11C 11/2259 |
| 2022/0178012 | A1 | * | 6/2022 | Funakubo ........... C23C 14/5806 |
| 2023/0012093 | A1 | * | 1/2023 | Kakushima ............ H10B 10/18 |
| 2023/0154998 | A1 | * | 5/2023 | Lu ........................ H01L 29/516 257/295 |

* cited by examiner

*Primary Examiner* — Evan G Clinton

(57) ABSTRACT

A semiconductor device according to an embodiment of the present disclosure includes a substrate, a first epitaxial electrode layer disposed on the substrate, a ferroelectric epitaxial layer disposed on the first epitaxial electrode layer, a dielectric epitaxial layer disposed on the ferroelectric epitaxial layer, and a second epitaxial electrode layer disposed on the dielectric epitaxial layer. The ferroelectric epitaxial layer implements a negative capacitance. Each of the first and second epitaxial electrode layers includes conductive pyrochlore oxide. The ferroelectric epitaxial layer and the dielectric epitaxial layer are electrically connected in series is non-ferroelectric. A dielectric structure comprising the ferroelectric epitaxial layer and the dielectric epitaxial layer is non-ferroelectric.

21 Claims, 16 Drawing Sheets

SEMICONDUCTOR DEVICE INCLUDING EPITAXIAL ELECTRODE LAYER AND DIELECTRIC EPITAXIAL STRUCTURE AND METHOD OF MANUFACTURING THE SAME

CROSS-REFERENCE TO RELATED APPLICATIONS

The present application claims priority under 35 U.S.C. § 119(a) to Korean Applications No. 10-2021-0132006, filed on Oct. 5, 2021 in the Korean Intellectual Property Office, which is incorporated herein by reference in its entirety.

BACKGROUND

1. Technical Field

The present disclosure generally relates to a semiconductor device, and more particularly, to a semiconductor device including an epitaxial electrode layer and a dielectric epitaxial layer and a method of manufacturing the same.

2. Related Art

As the feature size of a semiconductor chip decreases, the size of a capacitor device disposed in a semiconductor chip also decreases. However, the capacitance required for a dielectric layer that constitutes a capacitor device must be maintained at a minimum predetermined reference value in order to ensure reliable device operation. Therefore, an increase in the capacitance of such capacitor devices is advantageous and accordingly various methods are being studied for increasing the capacitance of the dielectric layer used in a capacitor device.

As representative examples of the various methods, a method of applying a high-k material to the dielectric layer of the capacitor device and a method of reducing the thickness of the dielectric layer have been studied. However, as the size of the capacitor device continues to decrease, the industry is demanding a capacitor device that satisfies the need for higher capacitance reference values and while maintaining low leakage current and high breakdown voltage.

SUMMARY

A semiconductor device according to an embodiment of the present disclosure includes a substrate, a first epitaxial electrode layer disposed on the substrate, a ferroelectric epitaxial layer disposed on the first epitaxial electrode layer, a dielectric epitaxial layer disposed on the ferroelectric epitaxial layer, and a second epitaxial electrode layer disposed on the dielectric epitaxial layer. Each of the first and second epitaxial electrode layers includes conductive pyrochlore oxide. The ferroelectric epitaxial layer and the dielectric epitaxial layer are electrically connected in series is non-ferroelectric. A dielectric structure comprising the ferroelectric epitaxial layer and the dielectric epitaxial layer is non-ferroelectric.

A semiconductor device according to another embodiment of the present disclosure includes a substrate, a first epitaxial electrode layer disposed on the substrate, a dielectric epitaxial layer disposed on the first epitaxial electrode layer, a ferroelectric epitaxial layer disposed on the dielectric epitaxial layer, and a second epitaxial electrode layer disposed on the ferroelectric epitaxial layer. Each of the first and second epitaxial electrode layers includes conductive pyrochlore oxide. The dielectric epitaxial layer and the ferroelectric epitaxial layer are electrically connected in series. A dielectric structure including the dielectric epitaxial layer and the ferroelectric epitaxial layer is non-ferroelectric.

A semiconductor device according to another embodiment of the present disclosure includes a substrate, and a capacitor disposed on the substrate. The capacitor includes a storage node epitaxial electrode, a ferroelectric epitaxial layer disposed on the storage node epitaxial electrode, a dielectric epitaxial layer disposed on the ferroelectric epitaxial layer, and a plate epitaxial electrode disposed on the dielectric epitaxial layer. Each of the storage node epitaxial electrode and the plate epitaxial electrode includes conductive pyrochlore oxide. The ferroelectric epitaxial layer and the dielectric epitaxial layer are electrically connected in series. The capacitor has a non-ferroelectric property.

DETAILED DESCRIPTION

Figure 1:
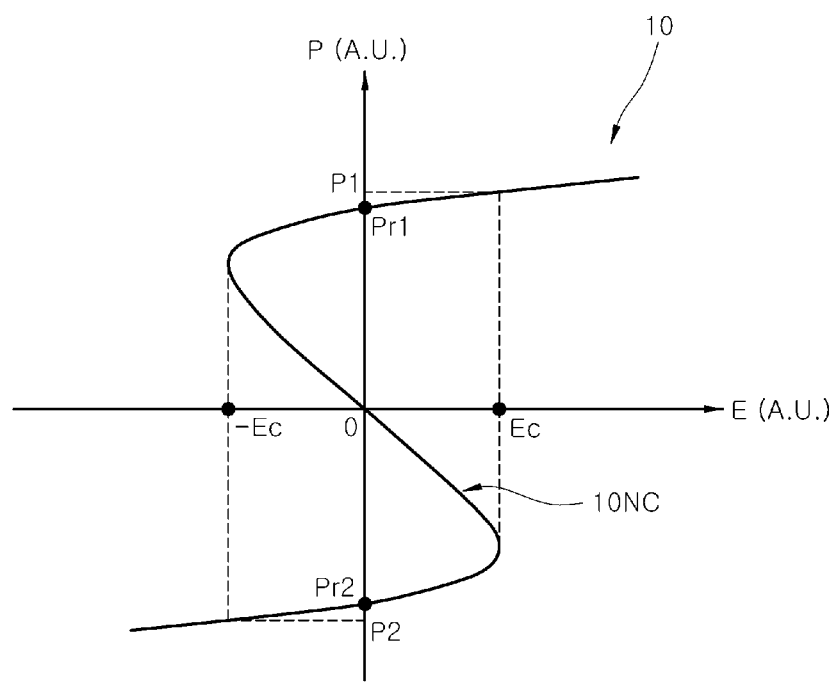
FIG. 1 is a graph schematically illustrating polarization properties of a ferroelectric layer according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as the stated order, and may be performed substantially at the same time. Also, at least a part of each of the above processes may be performed in a reversed order.

Figure 2:
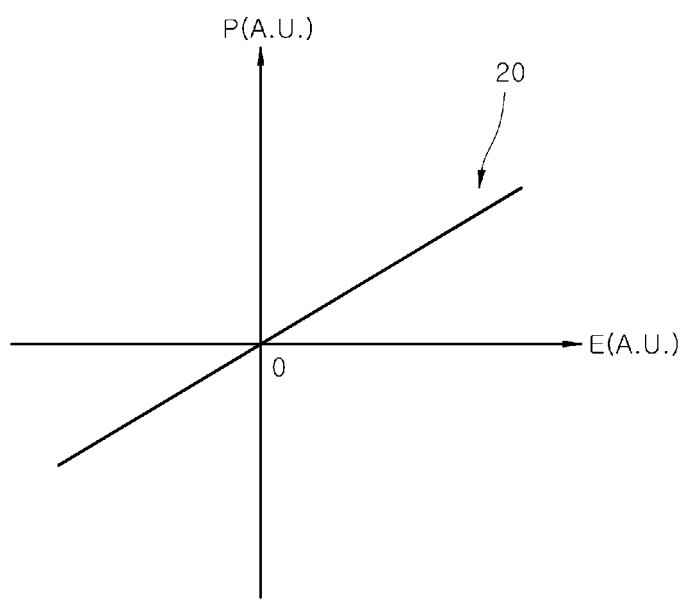
FIG. 2 is a graph schematically illustrating polarization properties of a dielectric layer according to an embodiment of the present disclosure.

FIG. 1 is a graph schematically illustrating polarization properties of a ferroelectric layer according to an embodiment of the present disclosure. Specifically, graph 10 illustrates a polarization change in a ferroelectric layer when an electric field is applied to both ends of the ferroelectric layer. FIG. 2 is a graph schematically illustrating polarization properties of a dielectric layer according to an embodiment of the present disclosure. Specifically, graph 20 illustrates a polarization change in a dielectric layer when an electric field is applied to both ends of the dielectric layer.

Referring to graph 10 of FIG. 1, a ferroelectric layer may have first and second remanent polarization Pr1 and Pr2, and first and second coercive fields Ec and −Ec. The first and second remanent polarization Pr1 and Pr2 may be polarization maintained in the ferroelectric layer in a state in which no electric field is applied to the ferroelectric layer. The first and second coercive fields Ec and −Ec may indicate the magnitude of electric fields required to switch the polarization orientation of the ferroelectric layer in opposite directions.

Referring to graph 10 of FIG. 1, as an embodiment, when the ferroelectric layer has the second remanent polarization Pr2 in an initial state, an electric field having a positive polarity may be applied to the ferroelectric layer to change the polarization of the ferroelectric layer. Referring to FIG. 1, the electric field may be applied to the ferroelectric layer while increasing the intensity in a sweep manner. When the electric field reaches the first coercive field Ec, the polarization of the ferroelectric layer may be changed to have the first polarization P1 after passing through the negative slope portion 1ONC on the graph 10. As another embodiment, when the ferroelectric layer has the first remanent polarization Pr1 in an initial state, an electric field having a negative polarity may be applied to the ferroelectric layer to change the polarization of the ferroelectric layer. Referring to FIG. 1, the electric field may be applied to the ferroelectric layer while increasing the intensity in a sweep manner. When the electric field reaches the second coercive field −Ec, the polarization of the ferroelectric layer may be changed to have the second polarization P2 after passing through the negative slope portion 10NC on the graph 10.

The capacitance of the ferroelectric layer may be proportional to the ratio $\Delta P/\Delta E$ of the polarization change $\Delta P$ according to the electric field change $\Delta E$ on the graph 10. In the electric field section corresponding to the negative slope portion 1ONC of the graph 10, that is, in the electric field section in which the ratio $\Delta P/\Delta E$ of the polarization change $\Delta P$ according to the electric field change $\Delta E$ has a negative value, the ferroelectric layer may exhibit negative capacitance. That is, when the polarization switching of the ferroelectric layer is performed under the first coercive field Ec, the polarization of the ferroelectric layer may change along a portion of the graph 10 indicating negative capacitance. Conversely, in the graph 10 of FIG. 1, in the remaining electric field section except for the electric field section corresponding to the negative slope portion 1ONC, that is, in the electric field section in which the ratio $\Delta P/\Delta E$ of the polarization change $\Delta P$ according to the electric field change $\Delta E$ has a positive value, the ferroelectric layer may exhibit positive capacitance.

Referring to the graph 20 of FIG. 2, the polarization behavior of a dielectric layer according to an initial electric field is illustrated. In this specification, unless otherwise specified, the dielectric layer may mean a non-ferroelectric layer. Accordingly, in FIG. 2, the dielectric layer does not exhibit any ferroelectric property. As an example, the dielectric layer may be a paraelectric layer.

Referring to the graph 20 of FIG. 2, when an electric field is applied to both ends of the dielectric layer while sweeping in a positive or negative direction, the polarization of the dielectric layer may increase from zero in proportion to the applied electric field. When the electric field is removed from the dielectric layer, the magnitude of the polarization may return to zero. That is, when no electric field is applied to the dielectric layer, the dielectric layer may not retain the remanent polarization.

Meanwhile, the capacitance of the ferroelectric layer may be proportional to the ratio $\Delta P/\Delta E$ of the polarization change $\Delta P$ according to the electric field change $\Delta E$ on the graph 20. Accordingly, the dielectric layer associated with the graph 20 of FIG. 2 may have a positive capacitance in the entire electric field section (i.e., in the electric field section corresponding to the negative slope portion 10NC in FIG. 1).

Although not necessarily limited to any theory, when a ferroelectric layer is bonded to a dielectric layer to form a dielectric structure, the ferroelectric layer in the dielectric structure may exhibit negative capacitance in a more stable manner compared to a case in which a ferroelectric layer is used without a dielectric layer. A dielectric structure in which a ferroelectric layer is bonded to a dielectric layer might not, as a whole, exhibit the ferroelectric properties. That is, the dielectric structure might not retain remanent polarization after an applied electric field is removed. For example, the dielectric structure may exhibit paraelectric properties.

Figure 3:
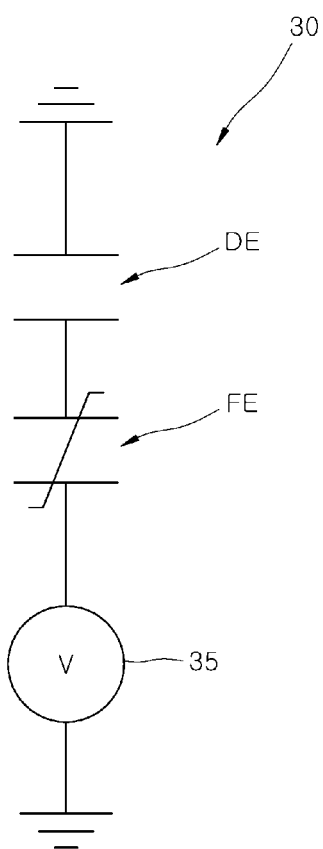
FIG. 3 is a view schematically illustrating an electrical circuit configuration of a dielectric structure according to an embodiment of the present disclosure.

FIG. 3 is a view schematically illustrating an electrical circuit configuration of a dielectric structure according to an embodiment of the present disclosure. Referring to FIG. 3, a dielectric structure 30 may include a dielectric layer DE and a ferroelectric layer FE that are electrically connected in series to each other. When a voltage is applied to both ends of the dielectric structure 30 by a power supply 35, the capacitance $C_T$ of the dielectric structure 30 may be calculated by the following equation (1).

$$1/(C_T)=1/(C_{DE})+1/(C_{FE}) \tag{1}$$

Here, $C_{DE}$ is a capacitance of the dielectric layer DE, and $C_{FE}$ is a capacitance of the ferroelectric layer FE. When each of the dielectric layer DE and the ferroelectric layer FE has a positive capacitance, the capacitance $C_T$ of the dielectric structure 30 may be less than the capacitance $C_{DE}$ and $C_{FE}$ of the dielectric layer DE and the ferroelectric layer FE, respectively.

In an example, in accordance with equation (1), when the dielectric layer DE has a positive capacitance and the ferroelectric layer FE has a negative capacitance within a certain voltage range, the capacitance $C_T$ of the dielectric structure 30 may be greater than the capacitance $C_{DE}$ of the dielectric layer DE. As a result, the capacitance $C_T$ of the dielectric structure 30 may be greater than the capacitance $C_{DE}$ of the dielectric layer DE when the ferroelectric layer FE and the dielectric layer DE are electrically connected in series to each other to form the dielectric structure 30.

As described above, the configuration of the dielectric structure 30 may be applied to various embodiments of the present disclosure described below. That is, when a dielectric structure includes a dielectric layer DE and a ferroelectric layer FE electrically connected in series to each other, the dielectric structure as a whole may have a non-ferroelectric property. A non-ferroelectric property may mean that the dielectric material does not have a remanent polarization and does not have a coercive field. As an example, the non-ferroelectric property may mean paraelectricity. In addition, the dielectric structure may exhibit an increased capacitance $C_T$ relative to that of the dielectric layer DE within a predetermined operating voltage range.

Figure 4:
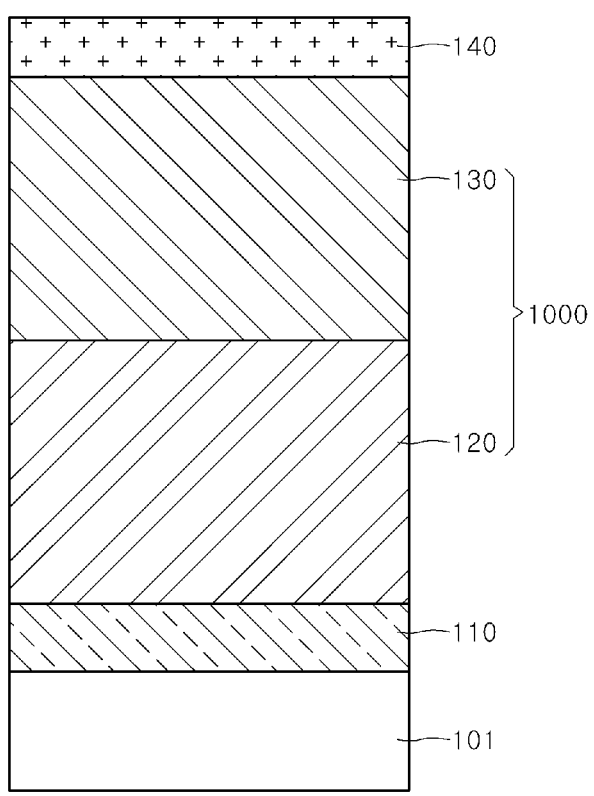
FIG. 4 is a cross-sectional view schematically illustrating a semiconductor device according to an embodiment of the present disclosure.

FIG. 4 is a cross-sectional view schematically illustrating a semiconductor device according to an embodiment of the present disclosure. Referring to FIG. 4, a semiconductor device 1 may include a substrate 101, a first epitaxial electrode layer 110 disposed on the substrate 101, a ferroelectric epitaxial layer 120 disposed on the first epitaxial electrode layer 110, a dielectric epitaxial layer 130 disposed on the ferroelectric epitaxial layer 120, and a second epitaxial electrode layer 140 disposed on the dielectric epitaxial layer 130. The first epitaxial electrode layer 110, the ferroelectric epitaxial layer 120, the dielectric epitaxial layer 130, and the second epitaxial electrode layer 140 may be epitaxial grown layers.

In the semiconductor device 1, the ferroelectric epitaxial layer 120 and the dielectric epitaxial layer 130 may be electrically connected in series to each other to configure a dielectric structure 1000 having a non-ferroelectric property between the first epitaxial electrode layer 110 and the second epitaxial electrode layer 140. That is, the dielectric structure 100 including the ferroelectric epitaxial layer 120 and the dielectric epitaxial layer 130 is non-ferroelectric. In an example, the ferroelectric epitaxial layer 120 may exhibit a negative capacitance, and the dielectric epitaxial layer 130 may exhibit a positive capacitance.

In an embodiment, the substrate 101 may have a fluorite-type crystal structure. In another embodiment, although not illustrated in FIG. 4, the substrate 101 may include a buffer layer having a fluorite-type crystal structure.

In this specification, the fluorite-type crystal structure may mean a fluorite crystal structure, or may mean a crystal structure in which the occupied sites of particles in the crystal lattice are similar to the occupied sites of particles in the fluorite crystal structure.

For example, the fluorite crystal structure may refer to a crystal structure of a compound having a chemical formula of $MX_2$ formed of an ionic bond. In this case, in the fluorite crystal structure, the cation M may occupy a regular site of the face-centered cubic (FCC) structure, and the anion X may occupy eight tetrahedral interstitial sites in a face-centered cubic (FCC) structure. A representative example of the fluorite crystal structure may be a crystal structure of calcium fluoride ($CaF_2$).

The substrate 101 may include yttria-stabilized zirconia (hereinafter, referred to "YSZ") or strontium tin oxide (hereinafter, referred to "STO"). As an example, the substrate 101 may be formed of YSZ or STO. The substrate 101 may function as a seed substrate utilized to form the first epitaxial electrode layer 110 as an epitaxial layer. In another example not illustrated, the substrate 101 may include a buffer layer including YSZ or STO. The buffer layer may form an interface with the first epitaxial electrode layer 110 and may function as a seed layer used to form the first epitaxial electrode layer 110 as an epitaxial layer.

The first epitaxial electrode layer 110 may be disposed on the substrate 101. The first epitaxial electrode layer 110 may include conductive pyrochlore oxide. The conductive pyrochlore oxide may have a fluorite-type crystal structure. The first epitaxial electrode layer 110 may be an epitaxial layer formed in a hetero-epitaxy method on the substrate 101. The hetero-epitaxy method may include, for example, pulse laser deposition (PLD), atomic layer deposition (ALD), chemical vapor deposition (CVD), or the like.

In an embodiment, the conductive pyrochlore oxide may have a chemical formula of $A_2B_2O_7$ (A and B are metal and O is oxygen) or $A_2B_2O_{7-\delta}$ (A and B are metal and O is oxygen, $0<\delta1<1$). The metal A, the metal B, and the oxygen of the conductive pyrochlore oxide may be disposed at sites distinct from each other in the crystal lattice of the fluorite crystal structure. For example, the conductive pyrochlore oxide may have a structure in which at least one of the metal A, the metal B, and the oxygen is vacant at some sites in the crystal lattice.

The conductive pyrochlore oxide may include, for example, lead iridium oxide ($Pb_2Ir_2O_7$), lanthanide iridium oxide ($La_2Ir_2O_7$), cerium iridium oxide ($Ce_2Ir_2O_7$), praseodymium iridium oxide ($Pr_2Ir_2O_7$), neodymium iridium oxide ($Nd_2Ir_2O_7$), samarium iridium oxide ($Sm_2Ir_2O_7$), gadolinium iridium oxide ($Gd_2Ir_2O_7$), ytterbium iridium oxide ($Yb_2Ir_2O_7$), lanthanum ruthenium oxide ($La_2Ru_2O_7$), cerium ruthenium oxide ($Ce_2Ru_2O_7$), praseodymium ruthenium oxide ($Pr_2Ru_2O_7$), neodymium ruthenium oxide ($Nd_2Ru_2O_7$), samarium ruthenium oxide ($Sm_2Ru_2O_7$), gadolinium ruthenium oxide ($Gd_2Ru_2O_7$), ytterbium ruthenium oxide ($Yb_2Ru_2O_7$), bismuth ruthenium oxide ($Bi_2Ru_2O_{7-\delta}$, $0<\delta<1$), lead ruthenium oxide ($Pb_2Ru_2O_{7-\delta}$, $0<\delta<1$), thallium ruthenium oxide ($Tl_2Ru_2O_{7-\delta}$, $0<\delta<1$), bismuth iridium oxide ($Bi_2Ir_2O_{7-\delta}$, $0<\delta<1$), lead iridium oxide ($Pb_2Ir_2O_{7-\delta}$, $0<\delta<1$), thallium iridium oxide ($Tl_2Ir_2O_{7-\delta}$, $0<\delta<1$), or a combination of two or more thereof.

Referring to FIG. 4, the ferroelectric epitaxial layer 120 may be disposed on the first epitaxial electrode layer 110. The ferroelectric epitaxial layer 120 may have a fluorite-type crystal structure. In an embodiment, the ferroelectric epitaxial layer 120 may have a crystal structure of an orthorhombic crystal system.

The ferroelectric epitaxial layer 120 may be formed using a hetero-epitaxy method on the first epitaxial electrode layer 110. The hetero-epitaxy method may include, for example, pulse laser deposition (PLD), atomic layer deposition (ALD), chemical vapor deposition (CVD), or the like. The ferroelectric epitaxial layer 120 may have a thickness of, for example, one to three nanometers (1 nm to 3 nm).

The ferroelectric epitaxial layer 120 may have a ferroelectric property, which was described above in connection with FIG. 1. As an example, the ferroelectric epitaxial layer 120 may have remanent polarization and a coercive field. In addition, the ferroelectric epitaxial layer 120 may exhibit a negative capacitance in a predetermined electric field section.

In an embodiment, the ferroelectric epitaxial layer 120 may include hafnium zirconium oxide. In another embodiment, the ferroelectric epitaxial layer 120 may include hafnium oxide doped with a dopant, or hafnium zirconium oxide doped with a dopant. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof.

Referring to FIG. 4, the dielectric epitaxial layer 130 may be disposed on the ferroelectric epitaxial layer 120. The dielectric epitaxial layer 130 may have a fluorite-type crystal structure. In an embodiment, the dielectric epitaxial layer 130 may have a crystal structure of a monoclinic crystal system or tetragonal crystal system.

The dielectric epitaxial layer 130 may be formed on the ferroelectric epitaxial layer 120 with a hetero-epitaxy method. The hetero-epitaxy method may include, for example, pulse laser deposition (PLD), atomic layer deposition (ALD), chemical vapor deposition (CVD), or the like. The dielectric epitaxial layer 130 may have a thickness of, for example, 1 nm to 3 nm.

The dielectric epitaxial layer 130 may have a non-ferroelectric property, as described above in connection with FIG. 2. The dielectric epitaxial layer 130 may exhibit a positive capacitance in the entire electric field section as described in graph 20 of FIG. 2. In an embodiment, the dielectric epitaxial layer 130 may include, for example, hafnium oxide, zirconium oxide, zirconium-doped hafnium zirconium oxide, or a combination of two or more thereof. As described above, the dielectric epitaxial layer 130 may include the same metal as the ferroelectric epitaxial layer 120, but may have a different crystal structure from the ferroelectric epitaxial layer 120. Together with the ferroelectric epitaxial layer 120, the dielectric epitaxial layer 130 may constitute the dielectric structure 1000.

Referring back to FIG. 4, the second epitaxial electrode layer 140 may be disposed on the dielectric epitaxial layer 130. The conductive pyrochlore oxide may have a fluorite-type crystal structure. The second epitaxial electrode layer 140 may be formed in a hetero-epitaxy method on the dielectric epitaxial layer 130. The hetero-epitaxy method may include, for example, pulse laser deposition (PLD), atomic layer deposition (ALD), chemical vapor deposition (CVD), or the like. In an embodiment, the second epitaxial electrode layer 140 may be formed of the same material as the first epitaxial electrode layer 110.

As described above, according to embodiments of the present disclosure, the first epitaxial electrode layer, the ferroelectric epitaxial layer, the dielectric epitaxial layer, and the second epitaxial electrode layer are sequentially disposed on the substrate, and each of the stacked layers may be formed of an epitaxial layer. Accordingly, the density of defects distributed at an interface between the first epitaxial electrode layer and the ferroelectric epitaxial layer, an interface between the ferroelectric epitaxial layer and the dielectric epitaxial layer, or an interface between the dielectric epitaxial layer and the second epitaxial electrode layer may be decreased. In addition, the ferroelectric epitaxial layer and the dielectric epitaxial layer are formed as epitaxial layers, so that polarization properties of the ferroelectric epitaxial layer and the dielectric epitaxial layer may be improved. As a result, it is possible to provide a semiconductor device having an increased capacitance, an increased breakdown voltage, and a reduced leakage current through improvement of the above-described interface characteristics and polarization characteristics.

Figure 5:
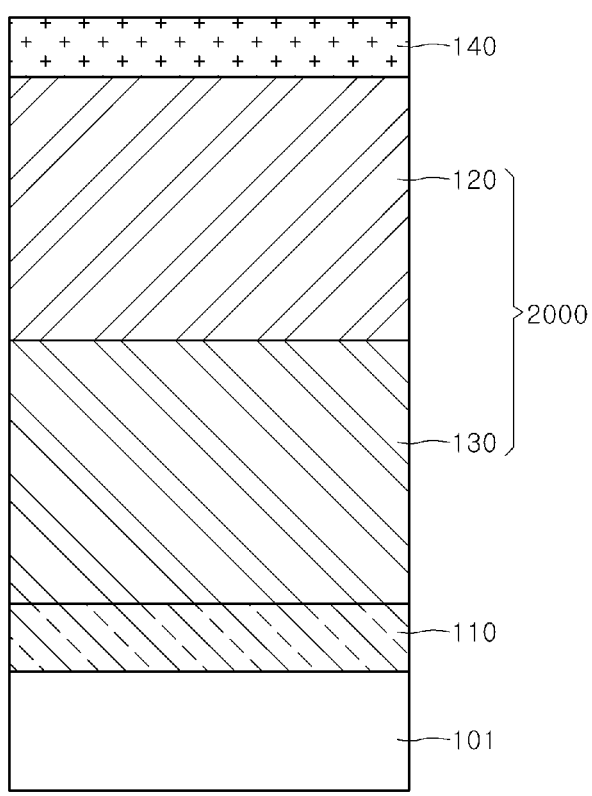
FIG. 5 is a cross-sectional view schematically illustrating a semiconductor device according to another embodiment of the present disclosure.

FIG. 5 is a cross-sectional view schematically illustrating a semiconductor device according to another embodiment of the present disclosure. Referring to FIG. 5, in a semiconductor device 2, the positions of a ferroelectric epitaxial layer 120 and a dielectric epitaxial layer 130 of a dielectric structure 2000 may be different from those of the semiconductor device 1 of FIG. 4. Except for the configuration related to the arrangement of the ferroelectric epitaxial layer 120 and the dielectric epitaxial layer 130, remaining configurations may be substantially the same as those of the semiconductor device 1 of FIG. 4.

Referring to FIG. 5, a first epitaxial electrode layer 110 may be disposed on a substrate 101. The dielectric epitaxial layer 130 may be disposed on the first epitaxial electrode layer 110. The dielectric epitaxial layer 130 may be formed on the first epitaxial electrode layer 110 using a hetero-epitaxy method. Examples of hetero-epitaxy methods may include, for example, pulse laser deposition (PLD), atomic layer deposition (ALD), chemical vapor deposition (CVD), or the like. The dielectric epitaxial layer 130 may have a thickness of, for example, 1 nm to 3 nm.

The ferroelectric epitaxial layer 120 may be disposed on the dielectric epitaxial layer 130. The ferroelectric epitaxial layer 120 may be an epitaxial layer formed by a hetero-epitaxy method on the dielectric epitaxial layer 130. The hetero-epitaxy method may include, for example, pulse laser deposition (PLD), atomic layer deposition (ALD), chemical vapor deposition (CVD), or the like. The ferroelectric epitaxial layer 120 may have a thickness of, for example, 1 nm to 3 nm.

The second epitaxial electrode layer 140 may be disposed on the ferroelectric epitaxial layer 120. The second epitaxial electrode layer 140 may be formed with a hetero-epitaxy method on the ferroelectric epitaxial layer 120. The hetero-epitaxy method may include, for example, pulse laser deposition (PLD), atomic layer deposition (ALD), chemical vapor deposition (CVD), or the like.

As described above, according to embodiments of the present disclosure, the first epitaxial electrode layer, the dielectric epitaxial layer, the ferroelectric epitaxial layer, and the second epitaxial electrode layer, which are sequentially disposed on the substrate, may all be formed of an epitaxial layer. Accordingly, the density of impurities or defects distributed at an interface between the first epitaxial electrode layer and the dielectric epitaxial layer, an interface between the dielectric epitaxial layer and the ferroelectric epitaxial layer, or an interface between the ferroelectric epitaxial layer and the second epitaxial electrode layer may be decreased. In addition, the ferroelectric epitaxial layer and the dielectric epitaxial layer are formed in epitaxial layers so that polarization properties of the ferroelectric epitaxial layer and the dielectric epitaxial layer may be improved. As a result, it is possible to provide a semiconductor device having an increased capacitance, an increased breakdown voltage, and a reduced leakage current through improvement of the above-described interface characteristics and polarization characteristics.

Figure 6:
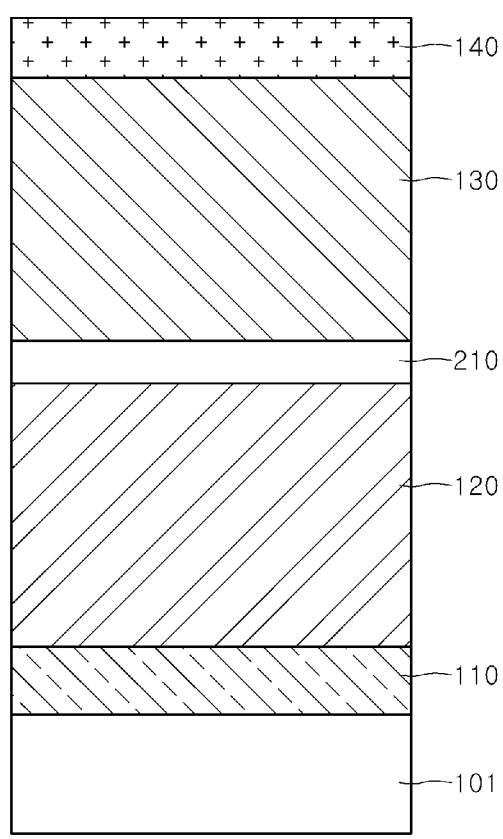
FIG. 6 is a cross-sectional view schematically illustrating a semiconductor device according to another embodiment of the present disclosure.

FIG. 6 is a cross-sectional view schematically illustrating a semiconductor device according to another embodiment of the present disclosure. Referring to FIG. 6, as compared to the semiconductor device 1 of FIG. 4, a semiconductor device 3 may further include a barrier insulation layer 210 disposed between a ferroelectric epitaxial layer 120 and a dielectric epitaxial layer 130. The barrier insulation layer 210 may include, for example, aluminum oxide, yttrium oxide, magnesium oxide, or a combination of two or more thereof.

The barrier insulation layer 210 may suppress material exchange between the ferroelectric epitaxial layer 120 and the dielectric epitaxial layer 130. Accordingly, it is possible to prevent or suppress changes in the material composition of both the ferroelectric epitaxial layer 120 and the dielectric epitaxial layer 130 that result from direct contact. Accordingly, the ferroelectric properties of the ferroelectric epitaxial layer 120 may be stabilized, and the non-ferroelectric properties of the dielectric epitaxial layer 130 may be stabilized. As a result, the effect of increasing capacitance through the electrical connection in series of the ferroelectric epitaxial layer 120 and the dielectric epitaxial layer 130 may be more reliably implemented in the semiconductor device 3.

In addition, the barrier insulation layer 210 may have a band gap energy greater than that of both the ferroelectric epitaxial layer 120 and the dielectric epitaxial layer 130. Accordingly, the barrier insulation layer 210 may form a potential barrier between the ferroelectric epitaxial layer 120 and the dielectric epitaxial layer 130. Therefore, the barrier insulation layer 210 may reduce the leakage current generated at an interface of the ferroelectric epitaxial layer 120 and the dielectric epitaxial layer 130 during the operation of the semiconductor device 3. As a result, the breakdown voltage of the semiconductor device 3 may be increased.

In an embodiment, the barrier insulation layer 210 may have an amorphous structure. However, the thickness of the barrier insulation layer 210 may be sufficiently thin so that when the dielectric epitaxial layer 130 is formed on the barrier insulating layer 210, the dielectric epitaxial layer 130 grows epitaxially along the crystal structure of the ferroelectric epitaxial layer 120 under the barrier insulation layer 210. That is, the dielectric epitaxial layer 130 may have a fluorite-type crystal structure even though the barrier insulation layer 210 is interposed therebetween. In an embodiment, the dielectric epitaxial layer 130 may have a crystal structure of a monoclinic crystal system or a tetragonal crystal system.

In some embodiments, the barrier insulation layer 210 may be applied to the semiconductor device 2 of FIG. 5. That is, a layer substantially similar to the barrier insulation layer 210 may be disposed between the dielectric epitaxial layer 130 and the ferroelectric epitaxial layer 120 of the dielectric structure 2000 in FIG. 5.

Figure 7:
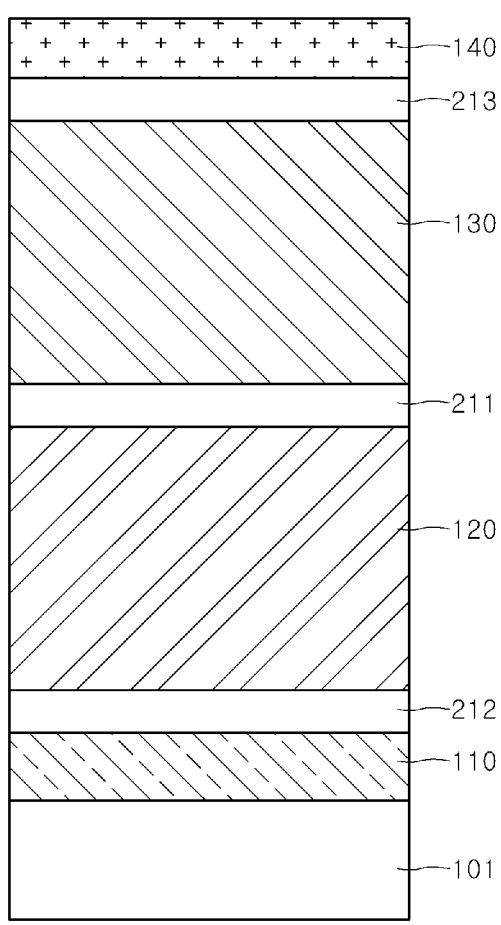
FIG. 7 is a cross-sectional view schematically illustrating a semiconductor device according to another embodiment of the present disclosure.

FIG. 7 is a cross-sectional view schematically illustrating a semiconductor device according to another embodiment of the present disclosure. A semiconductor device 4 of FIG. 7 may be different from a semiconductor device 3 described with reference to FIG. 6 with respect to the configuration of barrier insulation layers 211, 212, and 213. The remaining elements of semiconductor device 4 may be substantially the same as those of a semiconductor device 3 of FIG. 6, except for the barrier insulation layers 211, 212, and 213.

Referring to FIG. 7, semiconductor device 4 may include first to third barrier insulation layers 211, 212, and 213. The first barrier insulation layer may be substantially the same as the barrier insulation layer 210 of a semiconductor device 3 of FIG. 6.

The second barrier insulation layer 212 may be disposed between a first epitaxial electrode layer 110 and a ferroelectric epitaxial layer 120. The second barrier insulation layer 212 may suppress material exchange between the first epitaxial electrode layer 110 and the ferroelectric epitaxial layer 120. Accordingly, it is possible to prevent or suppress changes in the material composition of the ferroelectric epitaxial layer.

In addition, the band gap energy of the second barrier insulation layer 212 may be greater than the band gap energy of the ferroelectric epitaxial layer 120. Accordingly, the second barrier insulation layer 212 may form a potential barrier between the first epitaxial electrode layer 110 and the ferroelectric epitaxial layer 120. Thus, the second barrier insulation layer 212 may reduce leakage current generated at the interface between the first epitaxial electrode layer 110 and the ferroelectric epitaxial layer 120 during the operation of the semiconductor device 4. As a result, the breakdown voltage of the semiconductor device 4 may be increased.

The second barrier insulation layer 212 may have an amorphous structure. However, the thickness of the second barrier insulation layer 212 may be sufficiently thin so that when the ferroelectric epitaxial layer 120 is formed on the second barrier insulation layer 212, the ferroelectric epitaxial layer 120 grows epitaxially under the influence of the crystal structure of the first epitaxial electrode layer 110 disposed under the second barrier insulation layer 212. That is, the ferroelectric epitaxial layer 120 may have a fluorite-type crystal structure even though the second barrier insulation layer 212 is interposed therebetween. The ferroelectric epitaxial layer 120 may have a crystal structure of an orthorhombic crystal system. In an embodiment, the second barrier insulation layer 212 may include, for example, aluminum oxide, yttrium oxide, magnesium oxide, or a combination of two or more thereof.

The third barrier insulation layer 213 may be disposed between the dielectric epitaxial layer 130 and the second epitaxial electrode layer 140. The third barrier insulation layer 213 may suppress material exchange between the dielectric epitaxial layer 130 and the second epitaxial electrode layer 140. Accordingly, it is possible to prevent or suppress changes in the material composition of the dielectric epitaxial layer 130.

In addition, the band gap energy of the third barrier insulation layer 213 may be greater than that of the dielectric epitaxial layer 130. Accordingly, the third barrier insulation layer 213 may form a potential barrier between the dielectric epitaxial layer 130 and the second epitaxial electrode layer 140. As a result, the third barrier insulation layer 213 may reduce leakage current generated at the interface between the dielectric epitaxial layer 130 and the second epitaxial electrode layer 140 during the operation of a semiconductor device 4. As a result, the breakdown voltage of the semiconductor device 4 may be increased.

The third barrier insulation layer 213 may have an amorphous structure. However, the thickness of the third barrier insulation layer 213 may be sufficiently thin so that when the second epitaxial electrode layer 140 is formed on the third barrier insulation layer 213, the second epitaxial electrode layer 140 grows epitaxially under the influence of the crystal structure of the dielectric epitaxial layer 130, which is located under the third barrier insulation layer 213. That is, the second epitaxial electrode layer 140 may have a fluorite-type crystal structure even though the third barrier insulation layer 213 is interposed therebetween. In an embodiment, the third barrier insulation layer 213 may include, for example, aluminum oxide, yttrium oxide, magnesium oxide, or a combination of two or more thereof.

In some embodiments (not illustrated), one of either the second barrier insulation layer 212 or the third barrier insulation layer 213 may be omitted. For example, a semiconductor device 4 may include the first and second barrier insulation layers 211 and 212, or a semiconductor device 4 may include the first and third barrier insulation layers 211 and 213.

In some embodiments (not illustrated), combinations of the first to third barrier insulation layers 211, 212, and 213 may be similarly applied to a semiconductor device 2 of FIG. 5. For example, in the semiconductor device 2, a first barrier insulation layer may be disposed between the dielectric epitaxial layer 130 and the ferroelectric epitaxial layer 120, a second barrier insulation layer may be disposed between the first epitaxial electrode layer 110 and the dielectric epitaxial layer 130, and the third barrier insulation layer may be disposed between the ferroelectric epitaxial layer 120 and the second epitaxial electrode layer 140.

Figure 8A:
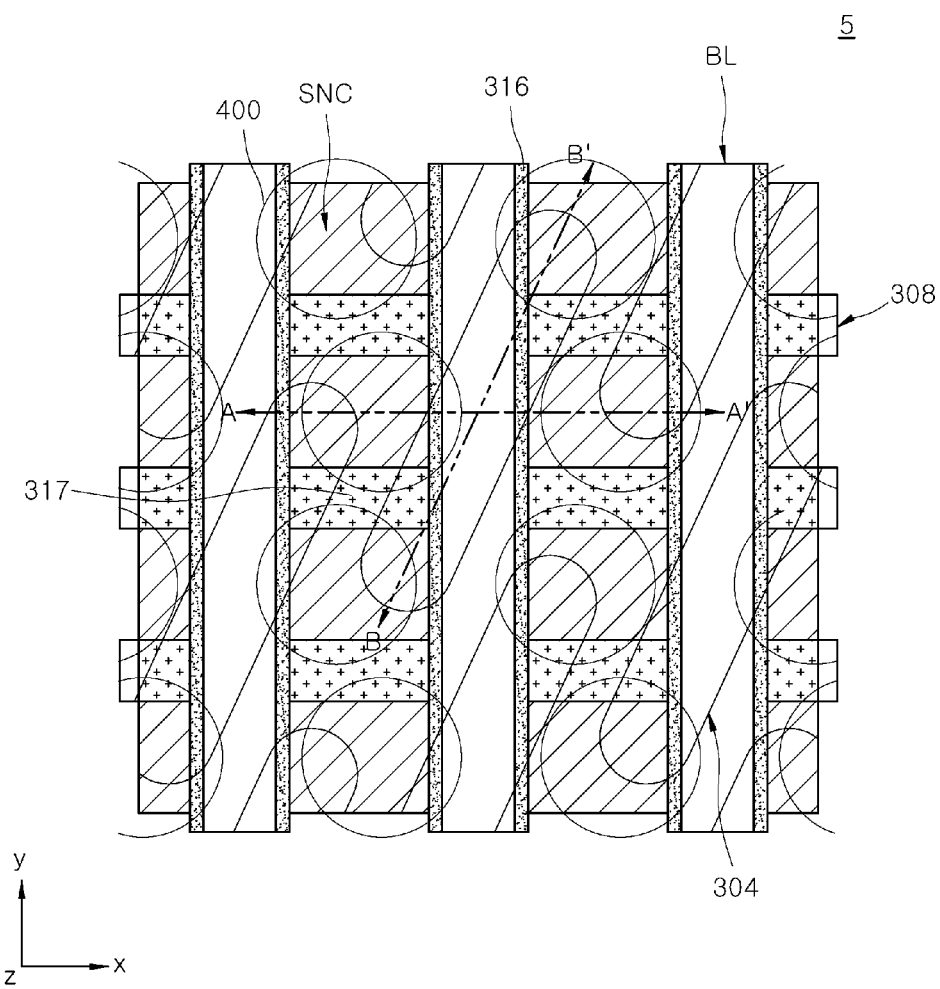
FIG. 8A is a plan view schematically illustrating memory cells of a semiconductor device according to an embodiment of the present disclosure.
Figure 8B:
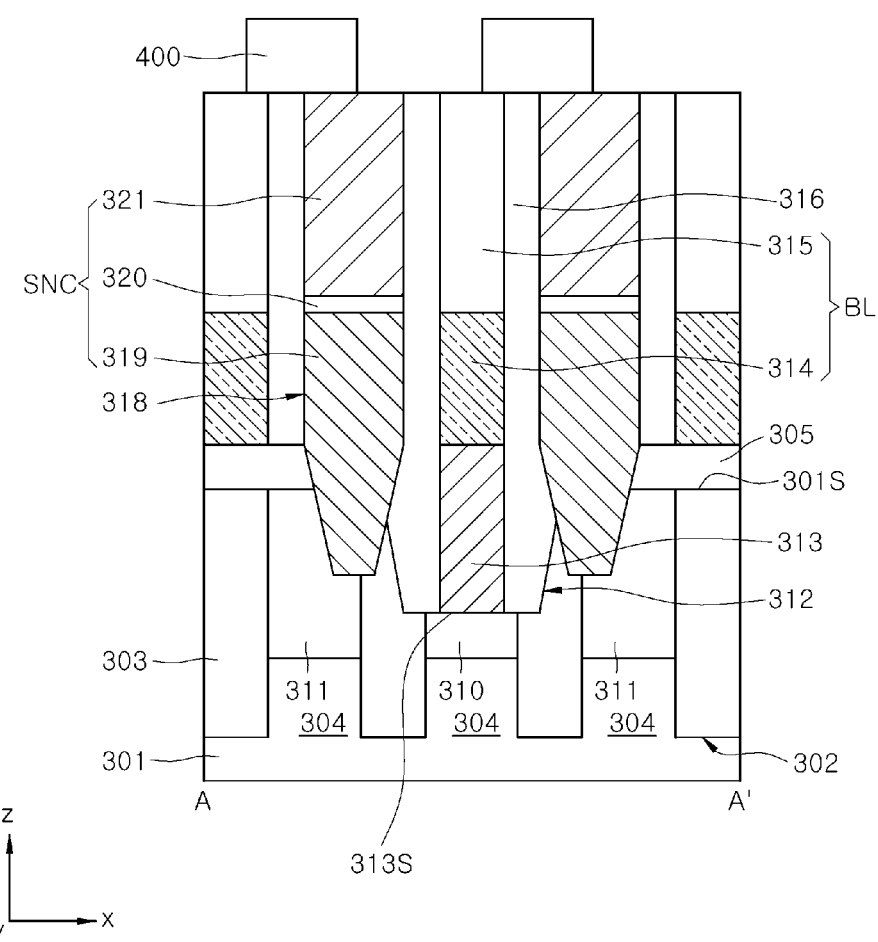
FIG. 8B is a cross-sectional view taken along line A-A' of a memory cell of FIG. 8A.
Figure 8C:
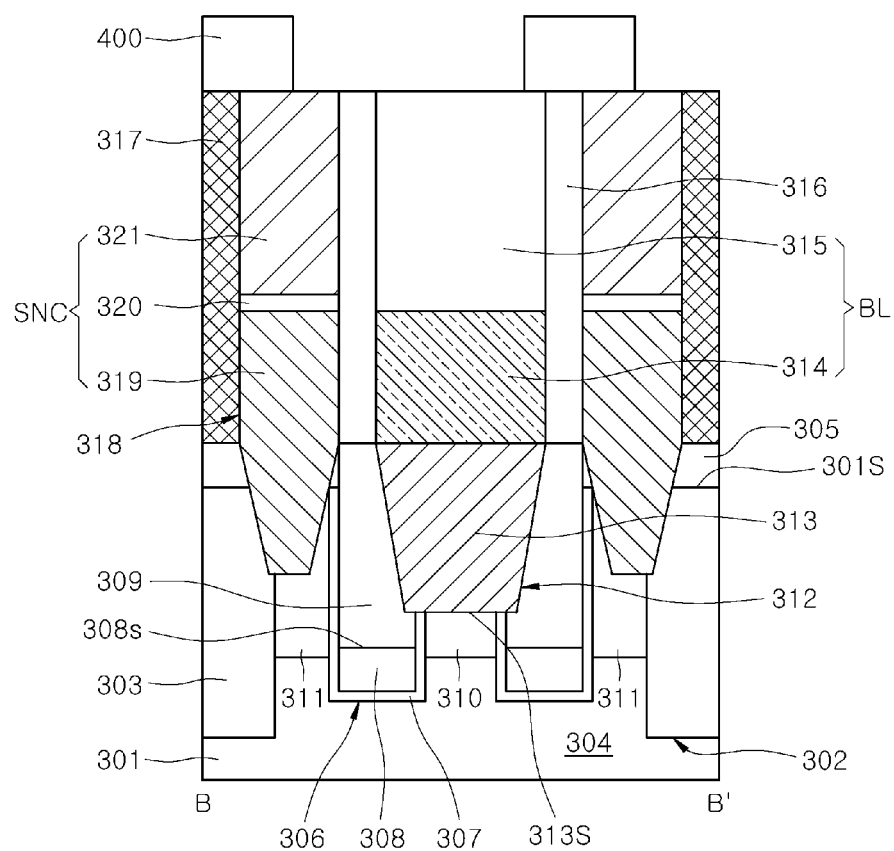
FIG. 8C is a cross-sectional view taken along line B-B' of a memory cell of FIG. 8A.

FIG. 8A is a plan view schematically illustrating memory cells of a semiconductor device according to an embodiment of the present disclosure. FIG. 8B is a cross-sectional view taken along line A-A' of a memory cell of FIG. 8A. FIG. 8C is a cross-sectional view taken along line B-B' of a memory cell of FIG. 8A.

Referring to FIGS. 8A to 8C, each of memory cells 5 may include a cell transistor that includes a buried word line 308, a bit line 314, and a capacitor 400.

A substrate 301 may include a semiconductor material. The substrate 301 may include device isolation layers 303 and active regions 304. The active regions 304 may be doped with an n-type dopant or a p-type dopant. A cell region of each of the active regions 304 may be doped with a p-type dopant. The active regions 304 may be defined as regions of the substrate 301, separated by the device isolation layers 303. The device isolation layers 303 may be formed by a shallow trench isolation (STI) process, and may be disposed in device isolation trenches 302 formed in the substrate 301.

Referring to FIG. 8C, word line trenches 306 may be formed in the substrate 301. A gate insulation layer 307 may be disposed on an inner surface of each of the word line trenches 306. A buried word line 308 may be disposed on the gate insulation layer 307. The buried word line 308 may partially fill the word line trench 306.

A word line capping layer 309 may be disposed on the buried word line 308 in each of the word line trenches 306. An upper surface 308S of the buried word line 308 may be positioned at a lower level than a surface 301S of the substrate 301. The buried word line 308 may include a conductive material. In an embodiment, the buried word line 308 may be a thin film structure including a titanium nitride layer and a tungsten layer. In another embodiment, the buried word line 308 may be made of a single titanium nitride layer or a single tungsten layer.

Referring to FIG. 8B and 8C, first and second doping regions 310 and 311 may be formed in the active regions 304 of the substrate 301. The first and second doping regions 310 and 311 may be spaced apart from each other by the word line trenches 306. One of the first and second doping regions 310 and 311 may be a source region of the cell transistor, and the other one may be a drain region of the cell transistor. The first and second doping regions 310 and 311 may include an n-type dopant such as arsenic (As) or phosphorus (P), for example.

As described above, a cell transistor may include the buried word line 308 and the first and second doping regions 310 and 311. The buried word line 308 may extend in the x-direction of FIG. 8A.

Referring to FIGS. 8B and 8C, a bit line contact plug 313 may be disposed over the substrate 301. The bit line contact plug 313 may be electrically connected to the first doping region 310. The bit line contact plug 313 may be disposed in a bit line contact hole 312. The bit line contact hole 312 may be formed in the substrate 301 and a hard mask layer 305 disposed on the substrate 301. A lower surface 313S of the bit line contact plug 313 may be positioned at a lower level than an upper surface 301S of the substrate 301. The bit line contact plug 313 may include a conductive material. A bit line structure BL may be disposed on the bit line contact plug 313. The bit line structure BL may include a bit line 314 in contact with the bit line contact plug 313 and a bit line hard mask 315, which is disposed on the bit line 314.

Referring to FIGS. 8A to 8C, the bit lines 314 may extend in a direction (e.g., y-direction) to crossing, from a plan view, the buried word lines 308. The bit lines 314 may be electrically connected to the first doping regions 310 through the bit line contact plugs 313. The bit lines 314 may include a conductive material. The bit line hard mask 315 may include an insulating material.

A bit line spacer 316 may be disposed on a sidewall of each of the bit line structures BL. As illustrated in FIG. 8A, in an example, the bit line spacer 316 may extend to cover both sidewalls of the bit line contact plug 313. The bit line spacer 316 may include silicon oxide, silicon nitride, or a combination thereof. In another embodiment, the bit line spacer 316 may include an air gap. As an example, the bit line spacer 316 may have a nitride-air gap-nitride (NAN) structure in which an air gap is positioned between silicon nitride layers.

Storage node contact (SNC) plugs may be disposed between the bit line structures BL. The storage node contact SNC plug may be disposed in a storage node contact hole 318. The storage node contact (SNC) plug may be electrically connected to the second doping region 311. In an embodiment, the storage node contact (SNC) plug may include a lower plug 319 and an upper plug 321. The storage node contact (SNC) plug may further include an ohmic contact layer 320 between the lower plug 319 and the upper plug 321. In an embodiment, the upper plug 321 may include metal, the lower plug 319 may include doped silicon, and the ohmic contact layer 320 may include metal silicide.

Referring to FIG. 8C, a plug separation layer 317 may be disposed on the hard mask layer 305. The plug separation layer 317 may be an insulating layer disposed between the adjacent bit line structures BL. Through the plug separation layer 317 and the hard mask layer 305, the storage node contact hole 318 may be formed over the active regions 304.

Referring to FIGS. 8A to 8C, capacitors 400 may be disposed on the storage node contact (SNC) plugs. A capacitor 400 may have a configuration of any one of a semiconductor device 1 of FIG. 4, a semiconductor device 2 of FIG. 5, a semiconductor device 3 of FIG. 6, and a semiconductor device 4 of FIG. 7. The configuration of the capacitor 400 will be described in more detail with reference to FIGS. 9A, 9B, 10A, 10B, 11A, and 11B below.

Figure 9A:
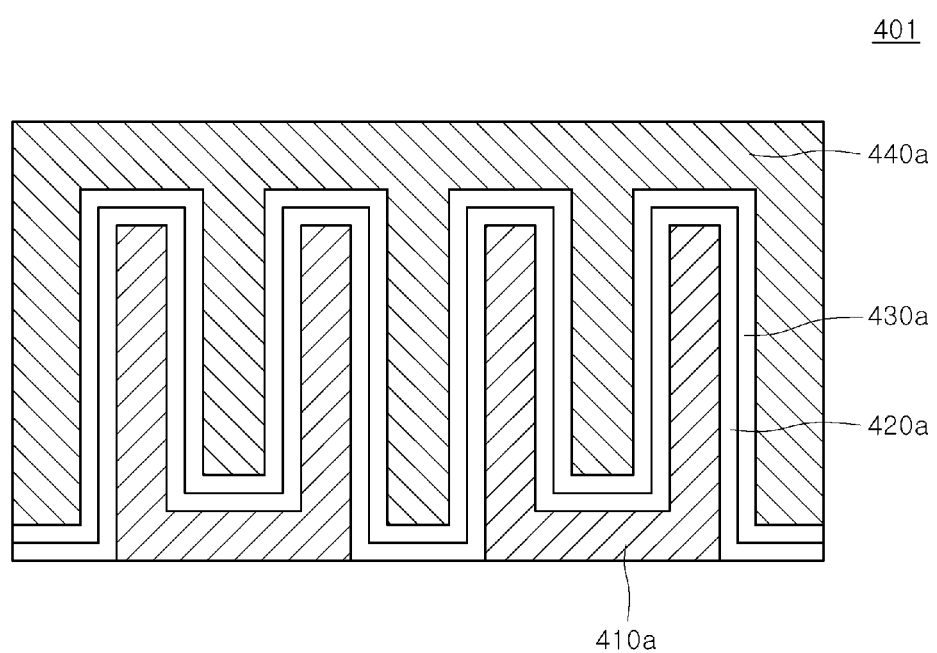
FIGS. 9A and 9B are cross-sectional views schematically illustrating capacitors of a semiconductor device according to an embodiment of the present disclosure.
Figure 9B:
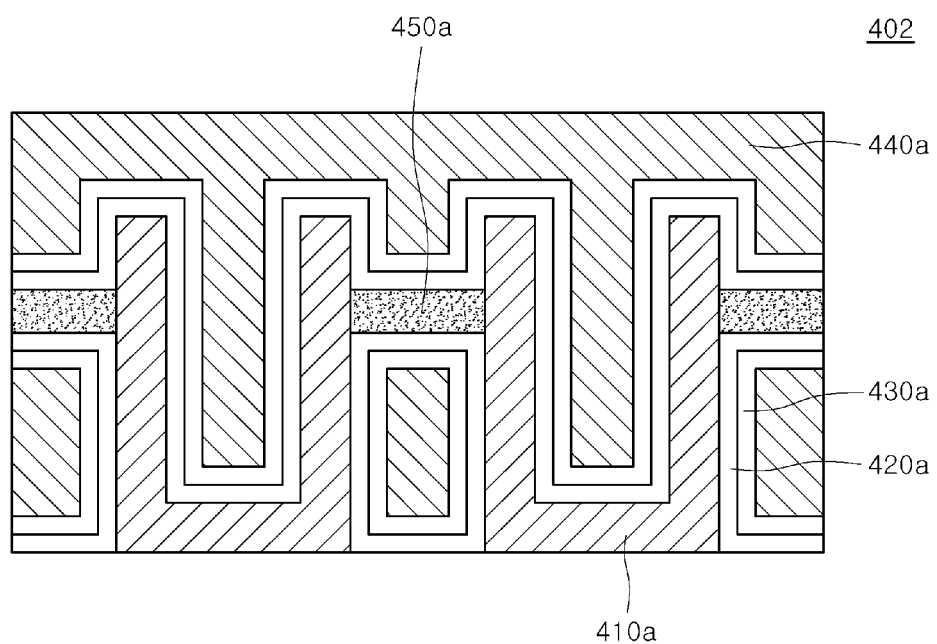

FIGS. 9A and 9B are cross-sectional views schematically illustrating capacitors of a semiconductor device according to an embodiment of the present disclosure. Capacitors 401 and 402 may be applied to capacitors 400 of a memory cell 5 of FIGS. 8A to 8C.

Referring to FIG. 9A, a capacitor 401 may include a storage node epitaxial electrode 410a, a ferroelectric epitaxial layer 420a disposed on the storage node epitaxial electrode 410a, a dielectric epitaxial layer 430a disposed on the ferroelectric epitaxial layer 420a, and a plate epitaxial electrode 440a disposed on the dielectric epitaxial layer 430a. The storage node epitaxial electrode 410a may be disposed on the storage node contact (SNC) plug of a memory cell 5 described above with reference to FIGS. 8A to 8C. The storage node epitaxial electrode 410a may be electrically connected to a second doping region 311 of a substrate 301.

Referring to FIG. 9A, the storage node epitaxial electrode 410a may have an open cylindrical shape. The ferroelectric epitaxial layer 420a may be disposed to cover inner and outer walls of the storage node epitaxial electrode 410a. The dielectric epitaxial layer 430a may be disposed to cover the ferroelectric epitaxial layer 420a. The plate epitaxial electrode 440a may be disposed to cover the dielectric epitaxial layer 430a.

In an embodiment, the capacitor 401 may be a semiconductor device 1 described with reference to FIG. 4. As an example, the storage node epitaxial electrode 410a and the plate epitaxial electrode 440a of the capacitor 401 may correspond to the first epitaxial electrode layer 110 and the second epitaxial electrode layer 140 of the semiconductor device 1 described with reference to FIG. 4. In addition, the ferroelectric epitaxial layer 420a and the dielectric epitaxial layer 430a of the capacitor 401 may correspond to the ferroelectric epitaxial layer 120 and the dielectric epitaxial layer 130 of the semiconductor device 1 described with reference to FIG. 4.

In another embodiment, the capacitor 401 may be a semiconductor device 2 described with reference to FIG. 5. In the semiconductor device 2 of FIG. 5, the arrangement of the ferroelectric epitaxial layer 120 and the dielectric epitaxial layer 130 may be reversed from that of the semiconductor device 1 of FIG. 4.

Correspondingly (not illustrated in FIG. 9A), in the capacitor 401, the dielectric epitaxial layer 430a may be disposed on the storage node epitaxial electrode 410a, the ferroelectric epitaxial layer 420a may be disposed on the dielectric epitaxial layer 430a, and the plate epitaxial electrode 440a may be disposed on the ferroelectric epitaxial layer 420a.

In another embodiment, the capacitor 401 may be a semiconductor device 3 described with reference to FIG. 6. The semiconductor device 3 of FIG. 6 may further include a barrier insulation layer 210, compared to a semiconductor device 1 of FIG. 4. Correspondingly (not illustrated in FIG. 9A), in the capacitor 401, a barrier insulation layer 210 may further be disposed between the ferroelectric epitaxial layer 420a and the dielectric epitaxial layer 430a.

In another embodiment (not illustrated in FIG. 9A), the capacitor 401 may be a semiconductor device 4 described with reference to FIG. 7. A semiconductor device 4 of FIG. 7 may further include first to third barrier insulation layers 211, 212, and 213, compared to the semiconductor device 1 of FIG. 4. Correspondingly, in the capacitor 401, a first barrier insulation layer may further be disposed between the ferroelectric epitaxial layer 420a and the dielectric epitaxial layer 430a, a second barrier insulation layer may further be disposed between the storage node epitaxial electrode 410a and the ferroelectric epitaxial layer 420a, and a third barrier insulation layer may further be disposed between the dielectric epitaxial layer 430a and the plate epitaxial electrode 440a.

A seed layer (not illustrated) may be disposed between the storage node contact (SNC) plug of FIGS. 8A to 8C and a storage node epitaxial electrode 410a of FIG. 9A. The seed layer may be a seed layer utilized to form the storage node epitaxial electrode 410a. The seed layer may have a fluorite-type crystal structure.

Referring to FIG. 9B, as compared to a capacitor 401 of FIG. 9A, a capacitor 402 may further include supporters 450a connecting adjacent storage node epitaxial electrodes 410a to each other. The supporters 450a may serve to physically support the outer walls of the storage node epitaxial electrodes 410a. The supporters 450a may improve the structural stability of the storage node epitaxial electrodes 410a. The supporters 450a may include, for example, silicon nitride.

Figure 10A:
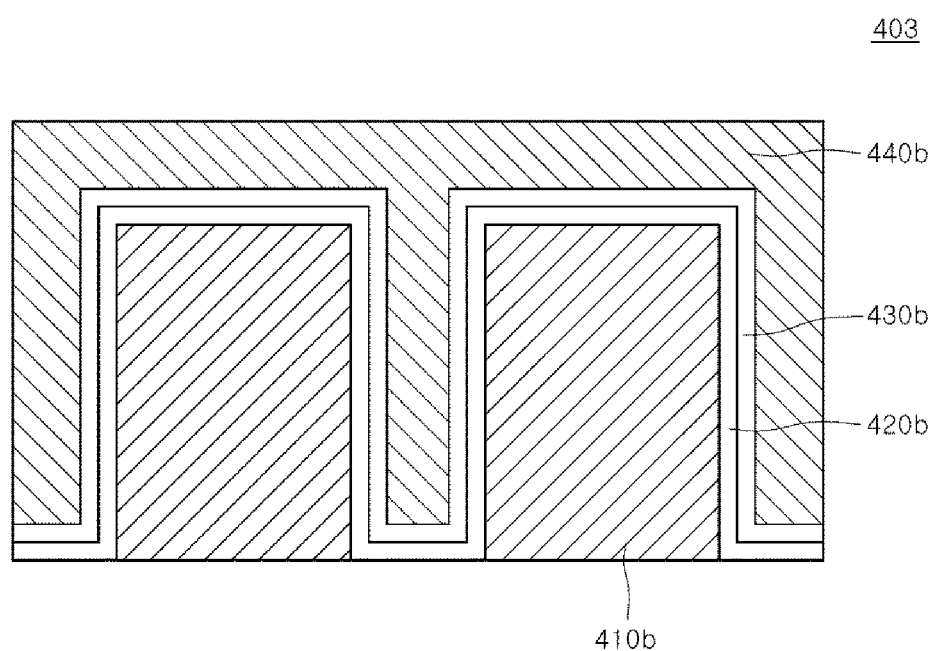
FIGS. 10A and 10B are cross-sectional views schematically illustrating capacitors according to another embodiment of the present disclosure.
Figure 10B:
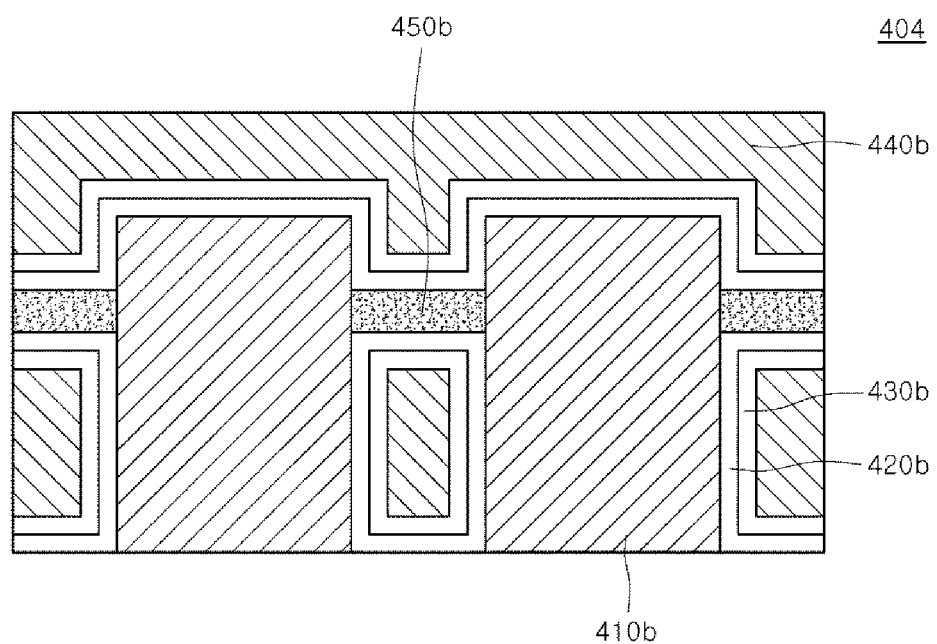

FIGS. 10A and 10B are cross-sectional views schematically illustrating capacitors according to another embodiment of the present disclosure. Capacitors 403 and 404 illustrated in FIGS. 10A and 10B may be applied to a capacitor 400 of a memory cell 5 of FIGS. 8A to 8C.

Referring to FIG. 10A, a capacitor 403 may include a storage node epitaxial electrode 410b, a ferroelectric epitaxial layer 420b disposed on the storage node electrode 410b, a dielectric epitaxial layer 430b disposed on the ferroelectric epitaxial layer 420b, and a plate epitaxial electrode 440b disposed on the dielectric epitaxial layer 430b.

The capacitor 403 may differ from the capacitor 401 of FIG. 9A with respect to a shape of the storage node epitaxial electrode 410b. Referring to FIG. 10A, the storage node epitaxial electrode 410b may have a shape of a solid pillar without inner sidewalls. Accordingly, the ferroelectric epitaxial layer 420b may be disposed to cover outer wall surfaces of the storage node epitaxial electrode 410b.

A seed layer (not illustrated) may be disposed between the storage node contact (SNC) plug of FIGS. 8A to 8C and a storage node epitaxial electrode 410b of FIG. 10A. The seed layer may be a seed layer that is used to form the storage node epitaxial electrode 410b. The seed layer may have a fluorite-type crystal structure.

Referring to FIG. 10B, compared to a capacitor 403 of FIG. 10A, a capacitor 404 may further include supporters 450b connecting adjacent storage node epitaxial electrodes 410b to each other. The supporters 450b may serve to physically support the outer walls of the storage node epitaxial electrodes 410b. The supporters 450b may improve the structural stability of the storage node epitaxial electrodes 410b. The supporters 450b may include, for example, silicon nitride.

Figure 11A:
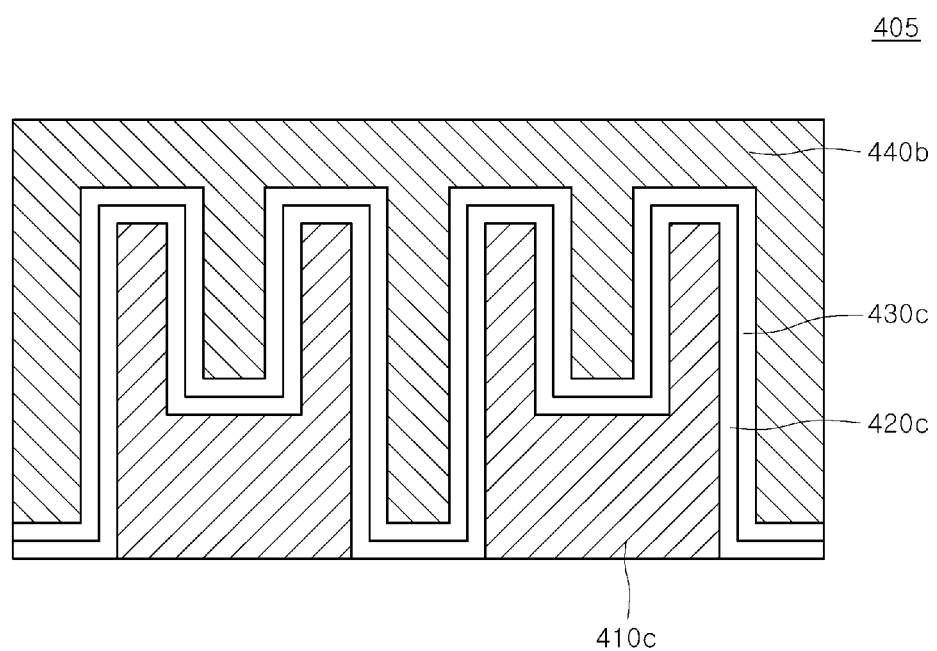
FIGS. 11A and 11B are cross-sectional views schematically illustrating capacitors according to another embodiment of the present disclosure.
Figure 11B:
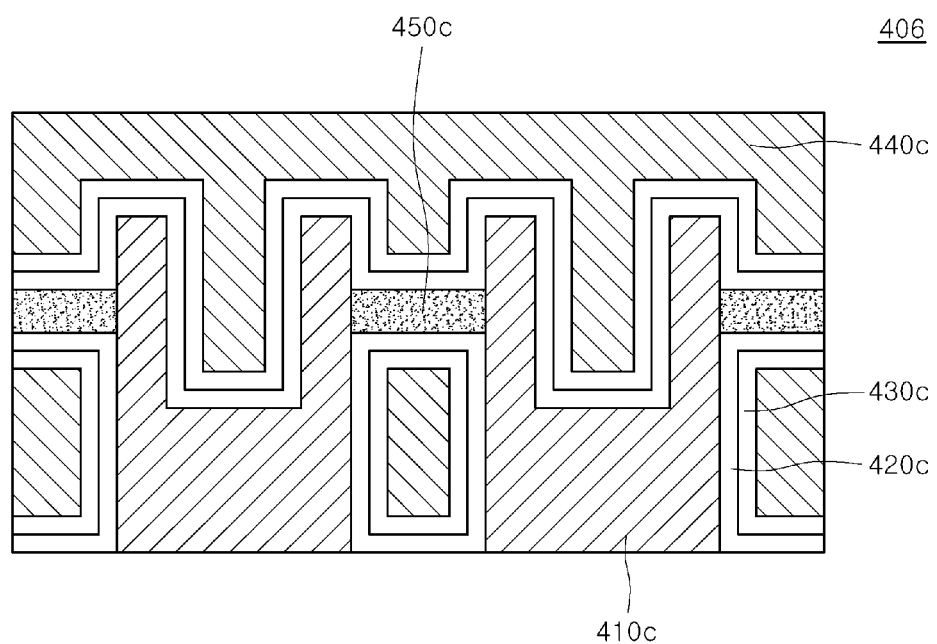

FIGS. 11A and 11B are cross-sectional views schematically illustrating capacitors according to another embodiment of the present disclosure. Capacitors 405 and 406 may be applied to a capacitor 400 of a memory cell 5 of FIGS. 8A to 8C.

Referring to FIG. 11A, a capacitor 405 may include a storage node epitaxial electrode 410c, a ferroelectric epitaxial layer 420c disposed on the storage node epitaxial electrode 410c, a dielectric epitaxial layer 430c disposed on the ferroelectric epitaxial layer 420c, and a plate epitaxial electrode 440c disposed on the dielectric epitaxial layer 430c.

The capacitor 405 may differ from a capacitor 401 of FIG. 9A in the shape of the storage node epitaxial electrode 410c. The configuration of the capacitor 405, other than the shape of the storage node epitaxial electrode 410c, may be substantially the same as that of the capacitor 401 of FIG. 9A. Referring to FIG. 11A, the shape of the storage node epitaxial electrode 410c may be a combination of an open cylindrical shape of the storage node epitaxial electrode 410a illustrated in FIG. 9A and the pillar shape of the storage node epitaxial electrode 410b illustrated in FIG. 10A.

A seed layer (not illustrated) may be disposed between the storage node contact (SNC) plug of FIGS. 8A to 8C and the storage node epitaxial electrode 410c of FIG. 11A. The seed layer may be a seed applied to form the storage node epitaxial electrode 410c. The seed layer may have a fluorite-type crystal structure.

Referring to FIG. 11B, a capacitor 406 may further include supporters 450c connecting the storage node epitaxial electrodes 410c to each other, compared to the capacitor 405 of FIG. 11A. The supporters 450c may serve to physically support the outer walls of adjacent storage node epitaxial electrodes 410c. The supporters 450c may improve structural stability of the storage node epitaxial electrodes 410c. The supporter 450c may include, for example, silicon nitride.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor device comprising:
a substrate;
a first epitaxial electrode layer disposed on the substrate;
a ferroelectric epitaxial layer disposed on the first epitaxial electrode layer;
a dielectric epitaxial layer disposed on the ferroelectric epitaxial layer; and
a second epitaxial electrode layer disposed on the dielectric epitaxial layer,
wherein each of the first and second epitaxial electrode layers includes conductive pyrochlore oxide, and
wherein the ferroelectric epitaxial layer and the dielectric epitaxial layer are electrically connected in series,
wherein a dielectric structure comprising the ferroelectric epitaxial layer and the dielectric epitaxial layer is non-ferroelectric, and
wherein the semiconductor device further comprises a first barrier insulation layer disposed between the ferroelectric epitaxial layer and the dielectric epitaxial layer.

2. The semiconductor device of claim 1, wherein the ferroelectric epitaxial layer has a negative capacitance.

3. The semiconductor device of claim 1, wherein the conductive pyrochlore oxide includes at least one selected from the group consisting of lead iridium oxide (Pb2Ir2O7), lanthanide iridium oxide (La2Ir2O7), cerium iridium oxide (Ce2Ir2O7), praseodymium iridium oxide (Pr2Ir2O7), neodymium iridium oxide (Nd2Ir2O7), samarium iridium oxide (Sm2Ir2O7), gadolinium iridium oxide (Gd2Ir2O7), ytterbium iridium oxide (Yb2Ir2O7), lanthanum ruthenium oxide (La2Ru2O7), cerium ruthenium oxide (Ce2Ru2O7), praseodymium ruthenium oxide (Pr2Ru2O7), neodymium ruthenium oxide (Nd2Ru2O7), samarium ruthenium oxide (Sm2Ru2O7), gadolinium ruthenium oxide (Gd2Ru2O7), ytterbium ruthenium oxide (Yb2Ru2O7), bismuth ruthenium oxide (Bi2Ru2O7−δ, 0<δ<1), lead ruthenium oxide (Pb2Ru2O7−δ, 0<δ<1), thallium ruthenium oxide (Tl2Ru2O7−δ, 0<δ<1), bismuth iridium oxide (Bi2Ir2O7−δ, 0<δ<1), lead iridium oxide (Pb2Ir2O7−δ, 0<δ<1), and thallium iridium oxide (Tl2Ir2O7−δ, 0<δ<1).

4. The semiconductor device of claim 1, wherein the ferroelectric epitaxial layer includes hafnium zirconium oxide.

5. The semiconductor device of claim 4, wherein the ferroelectric epitaxial layer includes a dopant doped in the hafnium zirconium oxide, and
wherein the dopant includes at least one selected from the group consisting of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), and lanthanum (La).

6. The semiconductor device of claim 1, wherein the dielectric epitaxial layer includes at least one selected from hafnium oxide, zirconium oxide, and zirconium (Zr)-doped hafnium zirconium oxide, and
wherein the dielectric epitaxial layer is non-ferroelectric.

7. The semiconductor device of claim 1, wherein the ferroelectric epitaxial layer has a crystal structure of an orthorhombic crystal system, and
wherein the dielectric epitaxial layer has a crystal structure of a monoclinic crystal system or a tetragonal crystal system.

8. The semiconductor device of claim 1, wherein each of the ferroelectric epitaxial layer and the dielectric epitaxial layer has a thickness of 1 nanometer (nm) to 3 nanometers (nm).

9. The semiconductor device of claim 1, wherein the first barrier insulation layer includes at least one selected from aluminum oxide, yttrium oxide, and magnesium oxide.

10. The semiconductor device of claim 9, further comprising at least one of a second barrier insulation layer disposed between the first epitaxial electrode layer and the ferroelectric epitaxial layer, and a third barrier insulation layer disposed between the dielectric epitaxial layer and the second epitaxial electrode layer.

11. The semiconductor device of claim 1, wherein the substrate includes yttria-stabilized zirconia (YSZ) or strontium tin oxide (STO).

12. A semiconductor device comprising:
a substrate;
a first epitaxial electrode layer disposed on the substrate;
a dielectric epitaxial layer disposed on the first epitaxial electrode layer;
a ferroelectric epitaxial layer disposed on the dielectric epitaxial layer; and
a second epitaxial electrode layer disposed on the ferroelectric epitaxial layer,
wherein each of the first and second epitaxial electrode layers includes conductive pyrochlore oxide, and
wherein the dielectric epitaxial layer and the ferroelectric epitaxial layer are electrically connected in series,
wherein a dielectric structure comprising the dielectric epitaxial layer and the ferroelectric epitaxial layer is non-ferroelectric, and
wherein the semiconductor device further comprises a first barrier insulation layer disposed between the ferroelectric epitaxial layer and the dielectric epitaxial layer.

13. The semiconductor device of claim 12, wherein the ferroelectric epitaxial layer has a negative capacitance.

14. The semiconductor device of claim 12, wherein the conductive pyrochlore oxide includes at least one selected from the group consisting of lead iridium oxide (Pb2Ir2O7), lanthanide iridium oxide (La2Ir2O7), cerium iridium oxide (Ce2Ir2O7), praseodymium iridium oxide (Pr2Ir2O7), neodymium iridium oxide (Nd2Ir2O7), samarium iridium oxide (Sm2Ir2O7), gadolinium iridium oxide (Gd2Ir2O7), ytterbium iridium oxide (Yb2Ir2O7), lanthanum ruthenium oxide (La2Ru2O7), cerium ruthenium oxide (Ce2Ru2O7), praseodymium ruthenium oxide (Pr2Ru2O7), neodymium ruthenium oxide (Nd2Ru2O7), samarium ruthenium oxide (Sm2Ru2O7), gadolinium ruthenium oxide (Gd2Ru2O7), ytterbium ruthenium oxide (Yb2Ru2O7), bismuth ruthenium oxide (Bi2Ru2O7−δ, 0<δ<1), lead ruthenium oxide (Pb2Ru2O7−δ, 0<δ<1), thallium ruthenium oxide (Tl2Ru2O7−δ, 0<δ<1), bismuth iridium oxide (Bi2Ir2O7−δ, 0<δ<1), lead iridium oxide (Pb2Ir2O7−δ, 0<δ<1), and thallium iridium oxide (Tl2Ir2O7−δ, 0<δ<1).

15. The semiconductor device of claim 12, wherein the ferroelectric epitaxial layer includes hafnium zirconium oxide.

16. The semiconductor device of claim 12, wherein the ferroelectric epitaxial layer includes a dopant doped in the hafnium zirconium oxide, and
wherein the dielectric epitaxial layer is non-ferroelectric.

17. The semiconductor device of claim 12, further comprising at least one of a second barrier insulation layer disposed between the first epitaxial electrode layer and the ferroelectric epitaxial layer, and a third barrier insulation layer disposed between the dielectric epitaxial layer and the second epitaxial electrode layer.

18. A semiconductor device comprising:
a substrate; and
a capacitor disposed on the substrate, wherein the capacitor comprises:
a storage node epitaxial electrode;
a ferroelectric epitaxial layer disposed on the storage node epitaxial electrode;
a dielectric epitaxial layer disposed on the ferroelectric epitaxial layer; and
a plate epitaxial electrode disposed on the dielectric epitaxial layer,
wherein each of the storage node epitaxial electrode and the plate epitaxial electrode includes conductive pyrochlore oxide,
wherein the ferroelectric epitaxial layer and the dielectric epitaxial layer are electrically connected in series,
wherein the capacitor has a non-ferroelectric property, and
wherein the capacitor further comprises a first barrier insulation layer disposed between the ferroelectric epitaxial layer and the dielectric epitaxial layer.

19. The semiconductor device of claim 18, wherein the ferroelectric epitaxial layer implements a negative capacitance.

20. The semiconductor device of claim 18, further comprising a field effect transistor disposed on the substrate and electrically connected to the capacitor.

21. The semiconductor device of claim 18, further comprising at least one of a second barrier insulation layer disposed between the storage node epitaxial electrode and the ferroelectric epitaxial layer, and a third barrier insulation layer disposed between the dielectric epitaxial layer and the plate epitaxial electrode.

* * * * *